United States Patent
He et al.

(10) Patent No.: US 9,906,196 B2
(45) Date of Patent: Feb. 27, 2018

(54) HYBRID SWITCHED MODE AMPLIFIER

(71) Applicant: Cirrus Logic International Semiconductor Ltd., Edinburgh (GB)

(72) Inventors: Zhaohui He, Austin, TX (US); Eric J. King, Dripping Springs, TX (US); Siddharth Maru, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/270,631

(22) Filed: Sep. 20, 2016

(65) Prior Publication Data

US 2017/0207759 A1  Jul. 20, 2017

Related U.S. Application Data

(63) Continuation-in-part of application No. 15/168,680, filed on May 31, 2016.
(Continued)

(51) Int. Cl.
*H03F 3/217* (2006.01)
*H03F 3/185* (2006.01)
(Continued)

(52) U.S. Cl.
CPC ............. *H03F 3/217* (2013.01); *H03F 3/185* (2013.01); *H03F 3/2173* (2013.01);
(Continued)

(58) Field of Classification Search
CPC ............. H03F 3/2178; H03F 2200/03; H03F 2200/231; H03F 1/0277; H03F 3/2171;
(Continued)

(56) References Cited

U.S. PATENT DOCUMENTS 3,851,269 A    11/1974  Szorc
6,348,781 B1    2/2002  Midya et al.
(Continued)

FOREIGN PATENT DOCUMENTS

EP    1367704 A2    12/2003
GB    2510395 A     8/2014
(Continued)

OTHER PUBLICATIONS

International Search Report and Written Opinion of the International Searching Authority, International Patent Application No. PCT/US2016/040072, dated Sep. 16, 2016, 10 pages.
(Continued)

*Primary Examiner* — Khanh V Nguyen
(74) *Attorney, Agent, or Firm* — Jackson Walker L.L.P.

(57) ABSTRACT

A switching power stage for producing a load voltage may include a first processing path having a first output, a second processing path having a second output, a first plurality of switches comprising at least a first switch coupled between the first output and a first load terminal and a second switch coupled between the first output and the second load terminal, a second plurality of switches comprising at least a third switch coupled between the second output and the first load terminal and a fourth switch coupled between the second output and the second load terminal, and a controller configured to control switches in order to generate the load voltage as a function of an input signal such that one of the first switch and the second switch operates in a linear region of operation and one of the third switch and the fourth switch operates in a saturated region of operation for a predominance of a dynamic rage of the load voltage.

28 Claims, 6 Drawing Sheets

Related U.S. Application Data

(60) Provisional application No. 62/279,956, filed on Jan. 18, 2016, provisional application No. 62/309,068, filed on Mar. 16, 2016.

(51) Int. Cl.
  *H03F 3/45* (2006.01)
  *H03F 1/04* (2006.01)
  *H03F 1/34* (2006.01)
  *H04R 3/12* (2006.01)

(52) U.S. Cl.
  CPC .......... *H03F 3/45475* (2013.01); *H03F 1/04* (2013.01); *H03F 1/34* (2013.01); *H03F 3/2171* (2013.01); *H03F 2200/351* (2013.01); *H03F 2200/432* (2013.01); *H03F 2203/45034* (2013.01); *H04R 3/12* (2013.01); *H04R 2420/03* (2013.01)

(58) Field of Classification Search
  CPC ........ H03F 1/083; H03F 3/217; H03F 3/2173; H03F 2200/372; G05F 1/575; H02M 3/158
  USPC .............................................. 330/251, 207 A
  See application file for complete search history.

(56) References Cited

U.S. PATENT DOCUMENTS

| | | | |
|---|---|---|---|
| 6,617,908 B1 | 9/2003 | Thomsen et al. | |
| 6,727,752 B2 | 4/2004 | Skinner et al. | |
| 7,084,799 B1 | 8/2006 | Butler | |
| 7,265,524 B2 | 9/2007 | Jordan et al. | |
| 7,466,194 B2 | 12/2008 | Mazda et al. | |
| 8,242,847 B1 | 8/2012 | Leong et al. | |
| 8,638,168 B1 | 1/2014 | Signoff et al. | |
| 9,088,211 B2 | 7/2015 | Ivanov et al. | |
| 9,628,033 B2* | 4/2017 | King | H03F 3/2178 |
| 9,647,611 B1 | 5/2017 | Embar et al. | |
| 2003/0122615 A1 | 7/2003 | Zeff | |
| 2003/0222713 A1 | 12/2003 | Skinner et al. | |
| 2004/0169552 A1 | 9/2004 | Butler | |
| 2005/0083115 A1 | 4/2005 | Risbo | |
| 2007/0229332 A1 | 10/2007 | Tsividis | |
| 2008/0111622 A1 | 5/2008 | Sperlich et al. | |
| 2008/0310046 A1 | 12/2008 | Menegoli et al. | |
| 2009/0027247 A1 | 1/2009 | Kumamoto et al. | |
| 2009/0212859 A1 | 8/2009 | Lesso et al. | |
| 2010/0214024 A1 | 8/2010 | Jones et al. | |
| 2010/0237941 A1 | 9/2010 | Goldfarb et al. | |
| 2012/0306575 A1 | 12/2012 | Shah et al. | |
| 2014/0028395 A1 | 1/2014 | Chan et al. | |
| 2015/0071464 A1 | 3/2015 | Du et al. | |
| 2015/0222184 A1 | 8/2015 | Melanson et al. | |
| 2015/0323947 A1 | 11/2015 | Amadi et al. | |
| 2016/0056707 A1 | 2/2016 | Wong et al. | |
| 2017/0207755 A1 | 7/2017 | He et al. | |
| 2017/0207759 A1 | 7/2017 | He et al. | |
| 2017/0271996 A1 | 9/2017 | King et al. | |
| 2017/0272043 A1 | 9/2017 | King et al. | |
| 2017/0272044 A1 | 9/2017 | Melanson et al. | |

FOREIGN PATENT DOCUMENTS

| | | |
|---|---|---|
| GB | 2546576 A | 7/2017 |
| JP | S59224905 A | 12/1984 |
| WO | 98/57422 A1 | 12/1998 |
| WO | 2007136800 A2 | 11/2007 |
| WO | 2017127132 A1 | 7/2017 |
| WO | 2017127353 A1 | 7/2017 |

OTHER PUBLICATIONS

Combined Search and Examination Report under Sections 17 and 18(3) of the UKIPO, Application No. GB1701269.1, dated Jul. 7, 2017.

Combined Search and Examination Report under Sections 17 and 18(3) of the UKIPO, Application No. GB1703492.7, dated Aug. 31, 2017.

Combined Search and Examination Report under Sections 17 and 18(3) of the UKIPO, Application No. GB1703865.4, dated Aug. 31, 2017.

Combined Search Report and Written Opinion, GB Application No. 1617096.1, dated Apr. 7, 2017.

Search Report, GB Application No. 1619679.2, dated Apr. 28, 2017.

International Search Report and Written Opinion of the International Searching Authority, International Patent Application No. PCT/US2017/020927, dated May 26, 2017.

International Search Report and Written Opinion of the International Searching Authority, International Patent Application No. PCT/US2017/021351, dated May 26, 2017.

International Search Report and Written Opinion of the International Searching Authority, International Patent Application No. PCT/US2017/013756, dated May 30, 2017.

International Search Report and Written Opinion of the International Searching Authority, International Application No. PCT/US2017/020911, dated Nov. 7, 2017.

\* cited by examiner

HYBRID SWITCHED MODE AMPLIFIER

RELATED APPLICATIONS

The present disclosure claims priority to U.S. Provisional Patent Application Ser. No. 62/309,068, filed Mar. 16, 2016, and is a continuation-in-part of U.S. patent application Ser. No. 15/168,680, filed May 31, 2016, which claims priority to U.S. Provisional Patent Application Ser. No. 62/279,956, filed Jan. 18, 2016, and both of which are incorporated by reference herein in their entirety.

FIELD OF DISCLOSURE

The present disclosure relates in general to circuits for audio devices, including without limitation personal audio devices such as wireless telephones and media players, and more specifically, to a switched mode amplifier including a switched mode converter for driving an audio transducer of an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a switching power stage for producing a load voltage at a load output of the switching power stage, wherein the load output comprising a first load terminal having a first load voltage and a second load terminal having a second load voltage such that the load voltage comprises a difference between the first load voltage and the second load voltage, may include a power converter comprising a power inductor and a first plurality of switches, wherein the power converter is configured to drive a power converter output terminal coupled to the first load terminal in order to drive the first load terminal, a linear amplifier configured to drive a linear amplifier output terminal coupled to the second load terminal in order to drive the second load terminal, a second plurality of switches comprising at least a first switch coupled between the power converter output terminal and the first load terminal and a second switch coupled between the power converter output terminal and the second load terminal such that the power converter output terminal and the first load terminal are coupled via the first switch and the power converter output terminal and the second load terminal are coupled via the second switch, and a third plurality of switches comprising at least a third switch coupled between the linear amplifier output terminal and the first load terminal and a fourth switch coupled between the linear amplifier output terminal and the second load terminal such that the linear amplifier output terminal and the first load terminal are coupled via the third switch and the linear amplifier output terminal and the second load terminal are coupled via the fourth switch. The switching power stage may also comprise a controller configured to control the first plurality of switches, the second plurality of switches, the third plurality of switches, and the linear amplifier in order to generate the load voltage as a function of an input signal to the controller such that energy delivered to the load output is supplied predominantly by the power converter, and such that one of the first switch and the second switch operates in a linear region of operation and one of the third switch and the fourth switch operates in a saturated region of operation for a predominance of a dynamic range of the load voltage.

In accordance with these and other embodiments of the present disclosure, a method may be provided for producing a load voltage at a load output of the switching power stage, the load output comprising a first load terminal having a first load voltage and a second load terminal having a second load voltage such that the load voltage comprises a difference between the first load voltage and the second load voltage, wherein the switching power stage comprises a power converter comprising a power inductor and a first plurality of switches, wherein the power converter is configured to drive a power converter output terminal coupled to the first load terminal in order to drive the first load terminal, a linear amplifier configured to drive a linear amplifier output terminal coupled to the second load terminal in order to drive the second load terminal, a second plurality of switches comprising at least a first switch coupled between the power converter output terminal and the first load terminal and a second switch coupled between the power converter output terminal and the second load terminal such that the power converter output terminal and the first load terminal are coupled via the first switch and the power converter output terminal and the second load terminal are coupled via the second switch, and a third plurality of switches comprising at least a third switch coupled between the linear amplifier output terminal and the first load terminal and a fourth switch coupled between the linear amplifier output terminal and the second load terminal such that the linear amplifier output terminal and the first load terminal are coupled via the third switch and the linear amplifier output terminal and the second load terminal are coupled via the fourth switch. The method may include controlling the first plurality of switches, the second plurality of switches, the third plurality of switches, and the linear amplifier in order to generate the load voltage as a function of an input signal to the controller such that energy delivered to the load output is supplied predominantly by the power converter, and such that one of the first switch and the second switch operates in a linear region of operation and one of the third switch and the fourth switch operates in a saturated region of operation for a predominance of a dynamic range of the load voltage.

In accordance with these and other embodiments of the present disclosure, a switching power stage for producing a load voltage at a load output of the switching power stage, wherein the load output comprises a first load terminal having a first load voltage and a second load terminal having a second load voltage such that the load voltage comprises a difference between the first load voltage and the second load voltage, may include a first processing path configured to process a first signal derived from an input signal to generate a first path voltage at a first processing path output, a second processing path configured to process a second signal derived from the input signal to generate a second path voltage at a second processing path output, a first plurality of switches comprising at least a first switch coupled between the first processing path output and the first load terminal and a second switch coupled between the first processing path output and the second load terminal, a second plurality of switches comprising at least a third switch coupled between the second processing path output and the first load terminal and a fourth switch coupled between the second processing path output and the second load terminal, and a controller configured to control the first plurality of switches and the second plurality of switches in order to generate the load voltage as a function of the input signal such that one of the first switch and the second switch operates in a linear region of operation and one of the third switch and the fourth switch operates in a saturated region of operation for a predominance of a dynamic range of the load voltage.

In accordance with these and other embodiments of the present disclosure, a method may be provided for producing a load voltage at a load output of a switching power stage, the load output comprising a first load terminal having a first load voltage and a second load terminal having a second load voltage such that the load voltage comprises a difference between the first load voltage and the second load voltage, wherein the switching power stage comprises a first processing path configured to process a first signal derived from an input signal to generate a first path voltage at a first processing path output, a second processing path configured to process a second signal derived from the input signal to generate a second path voltage at a second processing path output, a first plurality of switches comprising at least a first switch coupled between the first processing path output and the first load terminal and a second switch coupled between the first processing path output and the second load terminal, and a second plurality of switches comprising at least a third switch coupled between the second processing path output and the first load terminal and a fourth switch coupled between the second processing path output and the second load terminal. The method may include controlling the first plurality of switches and the second plurality of switches in order to generate the load voltage as a function of the input signal such that one of the first switch and the second switch operates in a linear region of operation and one of the third switch and the fourth switch operates in a saturated region of operation for a predominance of a dynamic range of the load voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
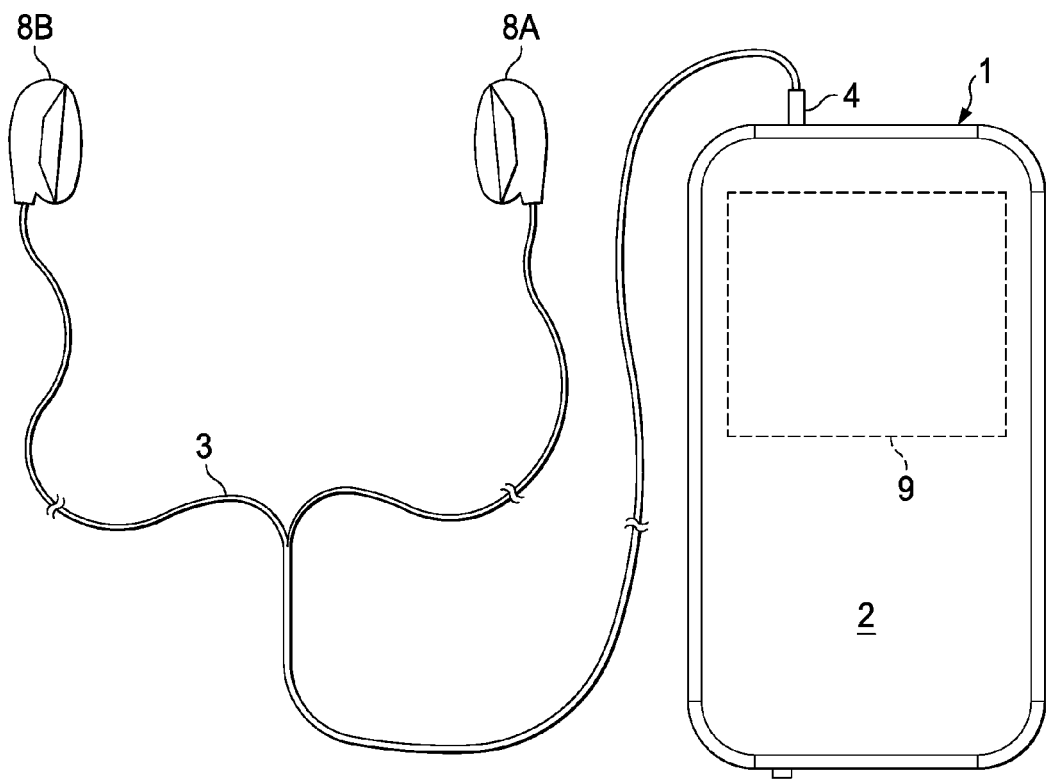
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
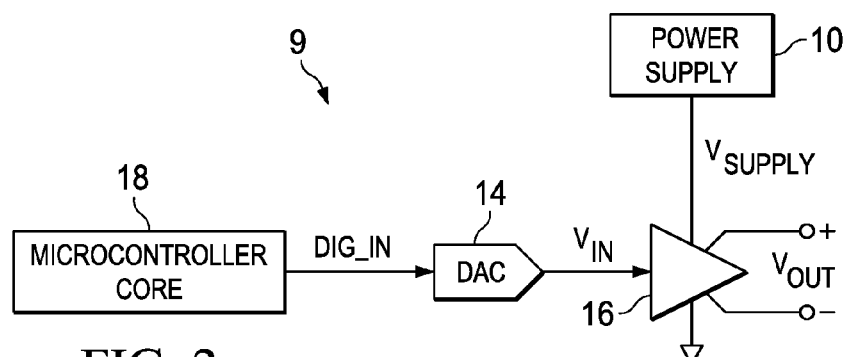
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a battery. Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 3:
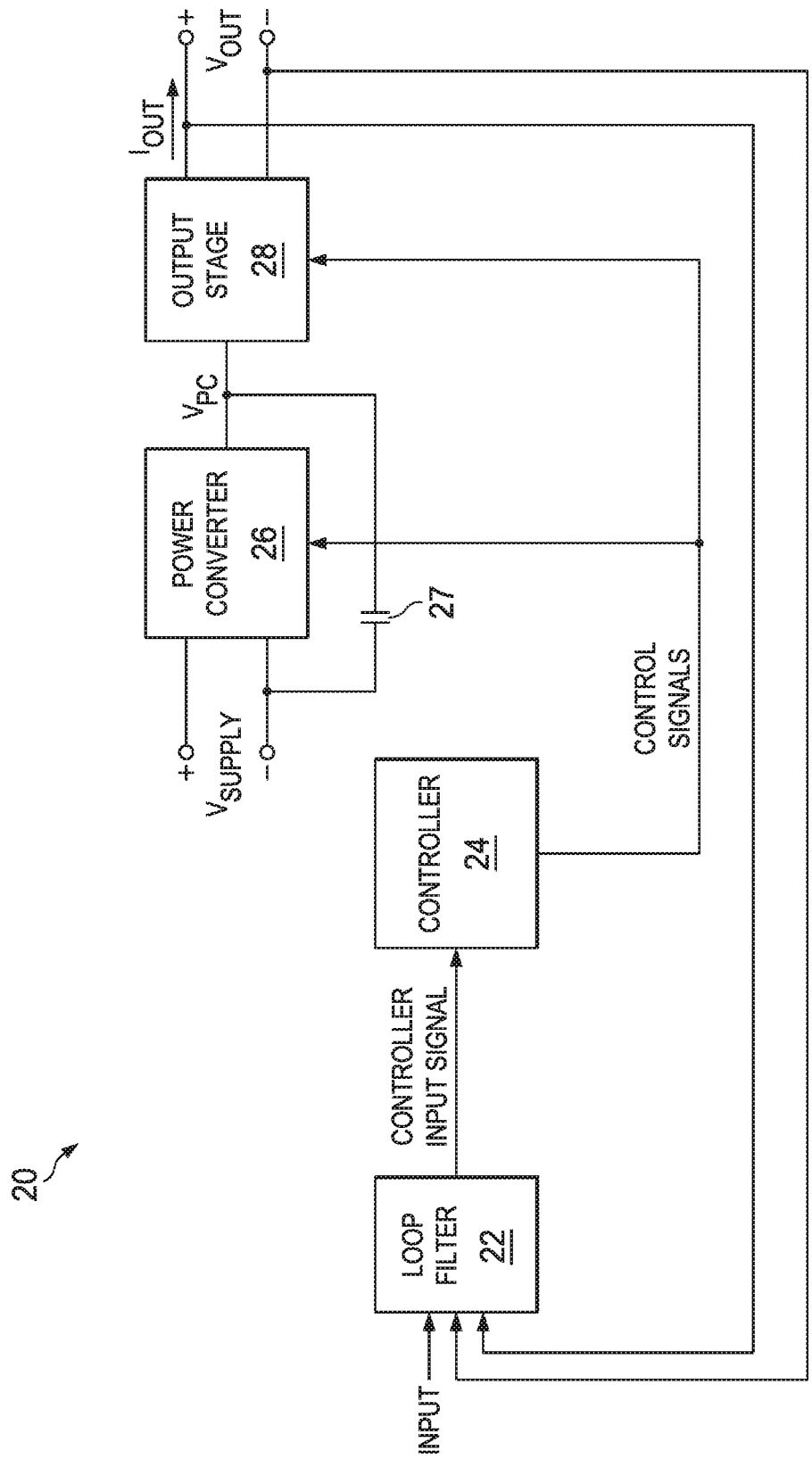
FIG. 3 illustrates a block and circuit diagram of selected components of an example switched mode amplifier, in accordance with embodiments of the present disclosure.

FIG. 3 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 2. As shown in FIG. 3, switched mode amplifier 20 may comprise a loop filter 22, a controller 24, a power converter 26, and an second control loop 28.

Loop filter 22 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to controller 24. In some embodiments, such controller input signal may comprise a signal indicative of an integrated error between the input signal and the feedback signal. In other embodiments, such controller input signal may comprise a signal indicative of a target current signal to be driven as an output current $I_{OUT}$ or a target voltage signal to be driven as an output voltage $V_{OUT}$ to a load coupled to the output terminals of second control loop 28.

Controller 24 may comprise any system, device, or apparatus configured to, based on an input signal (e.g., input signal INPUT), output signal $V_{OUT}$, and/or other characteristics of switched mode amplifier 20, control switching of switches integral to power converter 26, switches integral to second control loop 28, and/or one or more linear amplifiers integral to second control loop 28, in order to transfer electrical energy from a power supply $V_{SUPPLY}$ to the load of switched-mode amplifier 20 in accordance with the input signal.

Power converter 26 may receive at its input a voltage $V_{SUPPLY}$ (e.g., provided by power supply 10), and may generate at its output a voltage $V_{PC}$. In some embodiments, voltage $V_{SUPPLY}$ may be received via input terminals including a positive input terminal and a negative input terminal which may be coupled to a ground voltage. As described in greater detail in this disclosure (including, without limitation, in reference to FIG. 4, below), power converter 26 may comprise a power inductor and a plurality of switches that are controlled by control signals received from controller 24 in order to convert voltage $V_{SUPPLY}$ to voltage $V_{PC}$, such that audio output signal $V_{OUT}$ generated from voltage $V_{PC}$ is a function of the input signal to loop filter 22. Also as shown in FIG. 3, a capacitor 27 may be coupled between a second supply terminal (which may in some embodiments be coupled to ground) and the power converter output terminal. However, in other embodiments, capacitor 27 may be coupled between a first supply terminal and the power converter output terminal.

Figure 4:
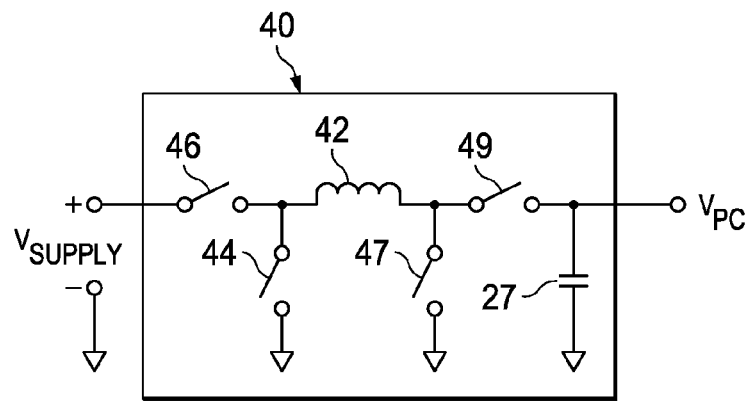
FIG. 4 illustrates a circuit diagram of selected components of an example boost converter that may be used to implement the power converter depicted in FIG. 3, in accordance with embodiments of the present disclosure.

Turning briefly to FIG. 4, a non-limiting example of a single-ended switching mode power supply which may be used to implement power converter 26 is described. FIG. 4 illustrates a circuit diagram of selected components of an example buck converter 40 that may be used to implement power converter 26 depicted in FIG. 3, in accordance with embodiments of the present disclosure. As shown in FIG. 4, buck converter 40 may include a power inductor 42, switches 44, 46, 47, and 49 and capacitor 27 arranged as shown. In operation, controller 24 may be configured to, when non-inverting buck-boost converter 40 is used to implement power converter 26, control switches 44, 46, 47, and 49 such that power converter output voltage $V_{PC}$ is a function of the controller input signal provided to controller 24.

Turning again to FIG. 3, second control loop 28 may receive at its input the power converter output voltage $V_{PC}$, and may generate at its output audio output signal $V_{OUT}$. As described in greater detail in this disclosure (including, without limitation, in reference to FIGS. 5A and 5B, below), second control loop 28 may comprise at least one linear amplifier and, in some embodiments, a plurality of switches, wherein the at least one linear amplifier and the plurality of switches, if present, are controlled by control signals received from controller 24 in order to convert power converter output voltage $V_{PC}$ to audio output signal $V_{OUT}$, such that audio output signal $V_{OUT}$ is a function of the input signal to loop filter 22.

Figure 5:
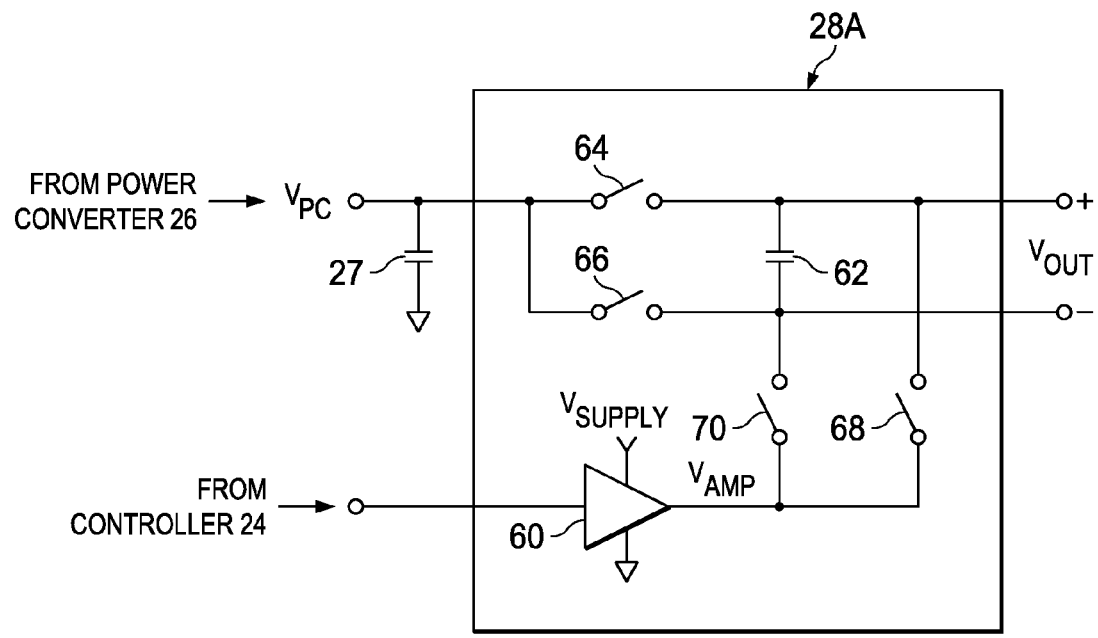
FIG. 5 illustrates a circuit diagram of selected components of an example output stage that may be used to implement the output stage depicted in FIG. 3, in accordance with embodiments of the present disclosure.
Figure 7:
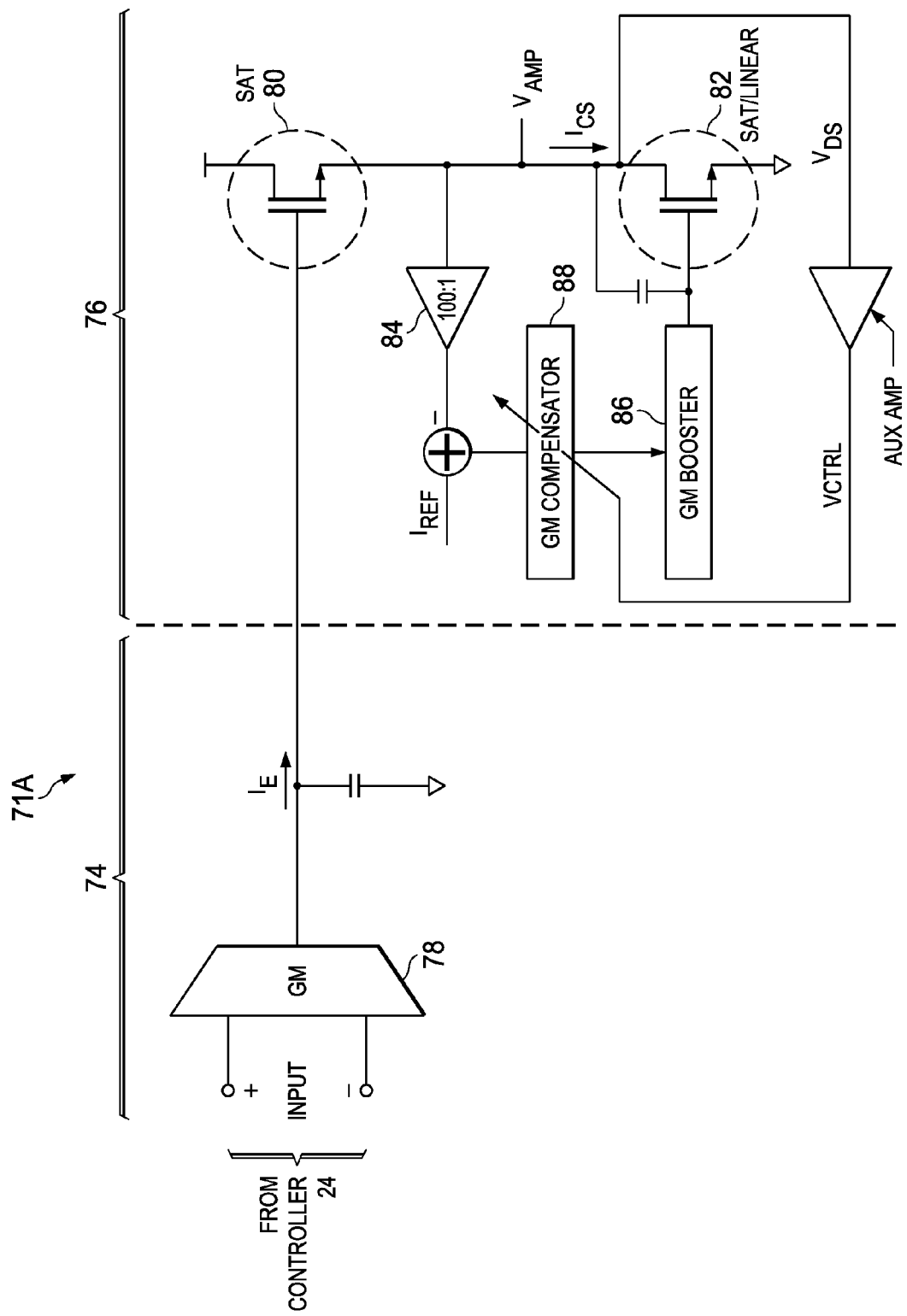
FIG. 7 illustrates a circuit diagram of selected components of an example linear amplifier that may be used to implement the linear amplifier depicted in FIG. 5, in accordance with embodiments of the present disclosure.

FIG. 5 illustrates a circuit diagram of selected components of an example output stage 28A that may be used to implement second control loop 28 depicted in FIG. 3, in accordance with embodiments of the present disclosure. As shown in FIG. 5, power converter 26 may drive power converter output voltage $V_{PC}$. Output stage 28A may comprise a plurality of switches including switch 64 coupled between the power converter output and a first output terminal of output stage 28A and switch 66 coupled between the power converter output and a second output terminal of output stage 28A. In addition, second control loop 28 may include a linear amplifier 60 (an example of which is depicted in FIG. 7) configured to drive a linear amplifier output voltage $V_{AMP}$. Output stage 28A may also include a plurality of switches including switch 68 coupled between the output of linear amplifier 60 and a first output terminal of output stage 28A and switch 70 coupled between the output of linear amplifier 60 and a second output terminal of output stage 28A.

In operation of output stage 28A, controller 24 may activate switches 64 and 70 and deactivate switches 66 and 68 for positive values of audio output signal $V_{OUT}$ and activate switches 66 and 68 and deactivate switches 64 and 70 for negative values of audio output signal $V_{OUT}$. Controller 24 may, as power converter output voltage $V_{PC}$ approaches the lower saturation limit, cause linear amplifier 60 to drive a non-zero linear amplifier output voltage $V_{AMP}$ in order to increase a common mode voltage between the first output terminal and the second output terminal, allowing audio output signal $V_{OUT}$ to approach and cross zero. Above the lower saturation limit of power converter output voltage $V_{PC}$, controller 24 may cause linear amplifier 60 to drive an approximately zero linear amplifier output voltage $V_{AMP}$ such that a magnitude of audio output signal $V_{OUT}$ is equal to power converter output voltage $V_{PC}$.

Figure 6:
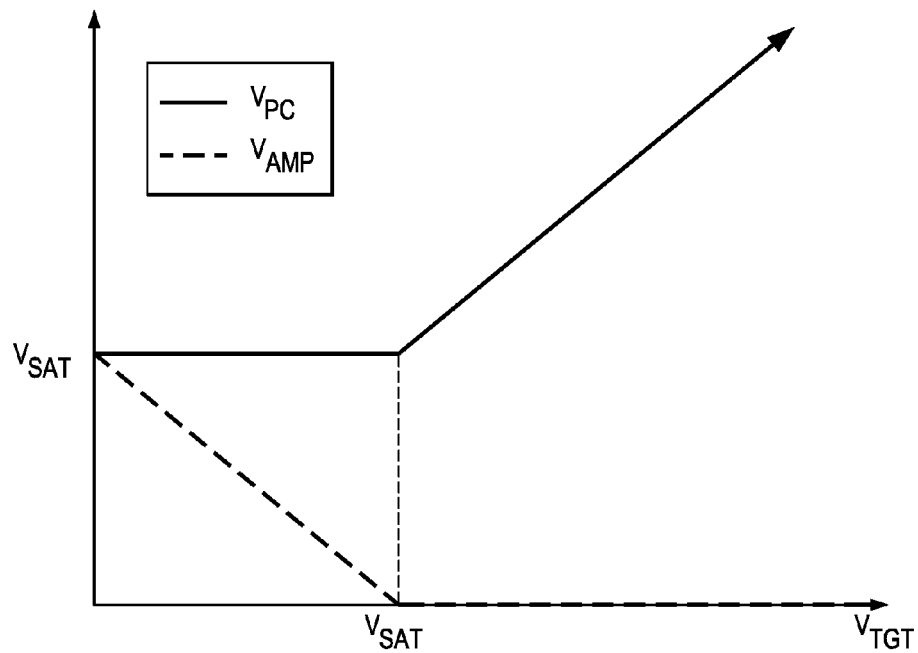
FIG. 6 illustrates a graph depicting the relationship of a voltage driven by the power converter depicted in FIG. 3 and a voltage driven by a linear amplifier of the output stage depicted in FIG. 3 as a function of a desired output voltage, in accordance with embodiments of the present disclosure.

In other words, controller 24 may control power converter 26 and linear amplifier 60 to generate voltages in accordance with the following functions, which are graphically depicted in FIG. 6, and wherein voltage $V_{TGT}$ represents a target or desired voltage to be output as audio output signal $V_{OUT}$ as indicated by the input signal to controller 24:

$$V_{PC}=V_{TGT}; \text{for } |V_{TGT}|>V_{SAT}$$

$$V_{PC}=V_{SAT}; \text{for } |V_{TGT}|\le V_{SAT}$$

$$V_{AMP}=0; \text{for } |V_{TGT}|>V_{SAT}$$

$$V_{AMP}=V_{SAT}-V_{TGT}; \text{for } |V_{TGT}|\le V_{SAT}$$

In some embodiments, an offset voltage may be added to each of the output of power converter 26 and the output of linear amplifier 60, to ensure that the voltage $V_{AMP}>0$ at all times.

Accordingly, presence of linear amplifier 60 and its ability to increase the common mode voltage of the output terminals in response to low magnitudes of the output signal $V_{OUT}$ may minimize non-linearities of output signal $V_{OUT}$ as a function of the input signal received by controller 24, and permit crossing a magnitude of zero by audio output signal $V_{OUT}$.

FIG. 7 illustrates a circuit diagram of selected components of an example linear amplifier 71A that may be used to implement linear amplifier 60 depicted in FIG. 5, in accordance with embodiments of the present disclosure. As shown in FIG. 7, linear amplifier 71A may include a first stage 74 and a second stage 76. First stage 74 may comprise a gain stage 78 having a transconductance gain Gm to convert a voltage signal INPUT received from controller 24 to a current $I_E$.

Second stage 76 may comprise a totem-pole topology with an input at a gate terminal of n-type field effect transistor (NFET) 80 and an output node shared by the drain terminal of NFET 82 of source terminal of NFET 80 at which linear amplifier 71A drives linear amplifier output voltage $V_{AMP}$. In such topology, NFET 80 may source current into a load coupled to the output node and NFET 82 may sink current from such load. A local current feedback loop may be arranged with respect to NFET 82 in order to regulate a minimum level of quiescent current through NFET 80. Thus, second stage 76 may be viewed as a source follower having a unity gain from its input node (e.g. gate terminal of NFET 80) to its output node.

Within the current feedback loop of second stage 76, a current-sensing amplifier 84 may sense a current associated with NFET 80 generating a scaled current to be compared with a reference current $I_{REF}$, resulting in an error current equal to the difference between the scaled current and reference current $I_{REF}$. A gain booster stage 86 may receive the error current and operate as a current mirror to compensate for loss of loop gain due to the current sensing scheme of current-sensing amplifier 84. At the output of gain booster stage 86, a conventional Miller-compensated common-source output scheme may be applied for stability as long as NFET 82 remains in its saturation region, which may be maintained by keeping its drain-to-source voltage $V_{DS}$ being greater than a saturation voltage $V_{d\_sat}$. For example, when drain-to-source voltage $V_{ds}$ becomes less than $V_{d\_sat}$ for a given drain-to-source voltage $I_{ds}$ of NFET 82, an output drain impendance of NFET 82 may decrease, and a voltage gain of NFET 82 will decrease accordingly. Consequently, the current loop gain and unity-gain bandwidth of the local current feedback loop may decrease. When such an amplifier is integral to a high-order feedback loop, reduction of unity-gain bandwidth may lead to system instability and must be avoided. Therefore, gain-compensator 88 may be present and may include a variable current gain as a function of drain-to-source voltage of NFET 82, which in the first order can be translated to an output impedance of NFET 82.

Figure 8:
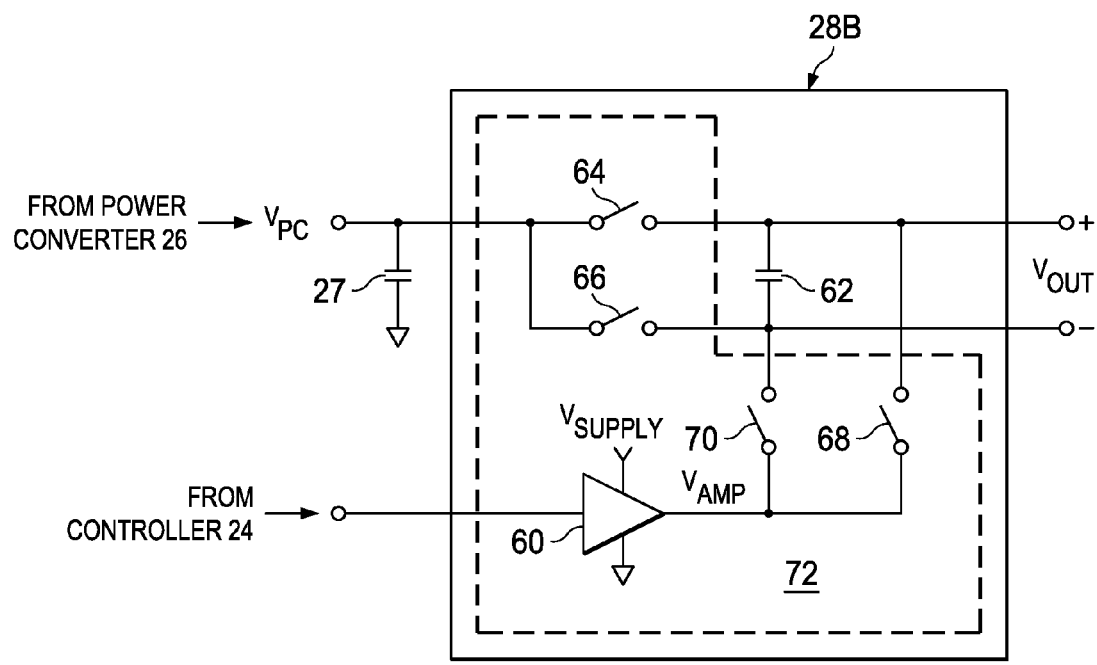
FIG. 8 illustrates a circuit diagram of selected components of another example output stage that may be used to implement the second control loop depicted in FIG. 3, in accordance with embodiments of the present disclosure.

FIG. 8 illustrates a circuit diagram of selected components of another example output stage 28B that may be used to implement second control loop 28 depicted in FIG. 3, in accordance with embodiments of the present disclosure. Output stage 28B of FIG. 8 may be similar in many respects to output stage 28A of FIG. 5, and thus, only the main differences between output stage 28B and output stage 28A are discussed in detail. One main difference between output stage 28B and output stage 28A is that in output stage 28B, linear amplifier 60, switch 64, switch 66, switch 68, and/or switch 70 may be integral to a final output stage of a differential amplifier 72.

Figure 9:
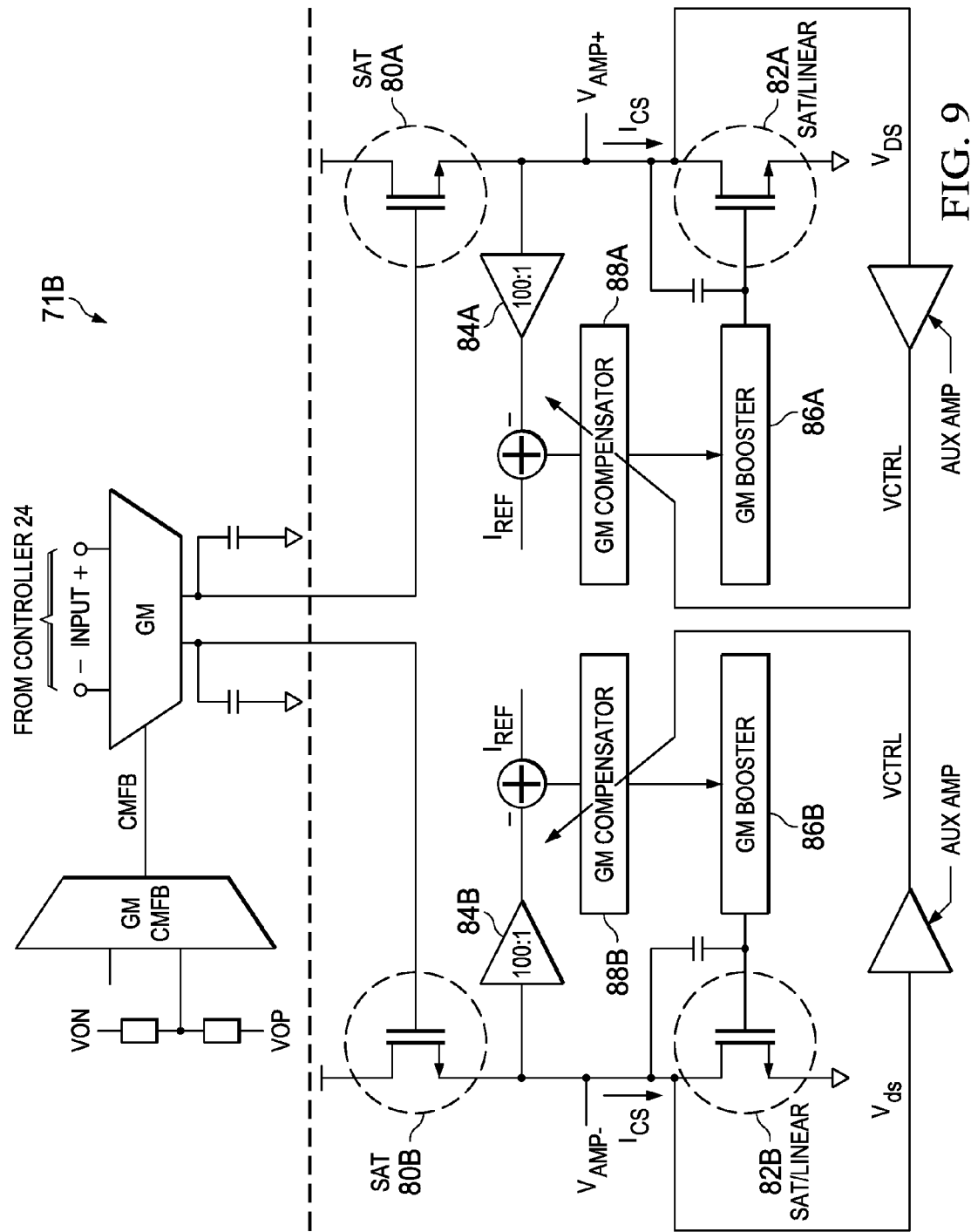
FIG. 9 illustrates a circuit diagram of selected components of an example linear amplifier that may be used to implement the linear amplifier depicted in FIG. 8, in accordance with embodiments of the present disclosure.

To further illustrate, FIG. 9 illustrates a circuit diagram of an example linear amplifier 71B which may be used to implement portions of the example output stage 28B depicted in FIG. 8, in accordance with embodiments of the present disclosure. As one of skill in the relevant art may recognize, linear amplifier 71B may comprise the differential-output analog to the single-ended topology of linear amplifier 71A depicted in FIG. 7, and analogous components of linear amplifier 71B have the same reference numerals as that of linear amplifier 71A with an additional letter "A" or "B" added to the reference numerals. In some embodiments, one or more of NFETs 80A, 80B, 82A, and 82B may be equivalent to switches 64, 66, 68, and 70, respectively, of output stage 28B of FIG. 8.

In these and other embodiments, additional circuitry may be present to cause the gate-to-source voltage of switch 66 and/or 64 to be at or greater than supply voltage(s) in order to operate as a switch (e.g., activate and deactivate). In these and other embodiments, switch 70 and/or 68 may operate in the linear region of such devices, wherein the gate-to-source voltage of such devices is less than the supply voltage.

In light of the foregoing, in operation, switches 68 and 70 of example output stage 28B may be viewed as ground-referenced devices in a first differential amplifier and switches 64 and 66 may be viewed as supply voltage-referenced devices of a second differential amplifier example output stage 28B. When viewed in such manner, the behavior of the amplifier described herein operates to control polarity and magnitude of output voltage $V_{OUT}$ by operating such first and second differential amplifiers such that, when implemented as transistors (e.g., n-type metal-oxide-semiconductor field-effect transistors), one switch in each of the differential amplifiers may operate in its saturation region while the remaining switch in each of the differential amplifiers may operate in its linear region. For example, when switch 64 operates in its saturated region, switch 66 may operate in its linear region, and vice versa. When switch 68 operates in its saturated region, switch 70 may operate in its linear region, and vice versa. Because of this behavior, non-idealities (such as high-frequency switching ripple) may be divided between such differential amplifiers such that the predominance of ripple is seen by one switch in each such differential amplifier.

In the foregoing discussion, embodiments are disclosed in which a capacitor 27 is coupled between the power converter output terminal and one of a first supply terminal having a first voltage and a second supply terminal having a second voltage, and embodiments are disclosed in which a capacitor 62 is coupled between the first load terminal and the second load terminal of switched mode amplifier 20. However, in these and other embodiments, a capacitor may be coupled between the first load terminal of switched mode amplifier 20 and one of the first supply terminal and the second supply terminal. In addition, in these and other embodiments, a capacitor may be coupled between the second load terminal of switched mode amplifier 20 and one of the first supply terminal and the second supply terminal.

As used herein, a "switch" may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches described herein are not depicted although such control signals would be present to selectively enable and disable such switches. In some embodiments, a switch may comprise a metal-oxide-semiconductor field-effect transistor (e.g., an n-type metal-oxide-semiconductor field-effect transistor).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A switching power stage for producing a load voltage at a load output of the switching power stage, the load output comprising a first load terminal having a first load voltage and a second load terminal having a second load voltage such that the load voltage comprises a difference between the first load voltage and the second load voltage, the switching power stage comprising:
   a power converter comprising a power inductor and a first plurality of switches, wherein the power converter is configured to drive a power converter output terminal coupled to the first load terminal in order to drive the first load terminal;
   a linear amplifier configured to drive a linear amplifier output terminal coupled to the second load terminal in order to drive the second load terminal;
   a second plurality of switches, comprising at least a first switch coupled between the power converter output terminal and the first load terminal and a second switch coupled between the power converter output terminal and the second load terminal such that the power converter output terminal and the first load terminal are coupled via the first switch and the power converter output terminal and the second load terminal are coupled via the second switch;
   a third plurality of switches, comprising at least a third switch coupled between the linear amplifier output terminal and the first load terminal and a fourth switch coupled between the linear amplifier output terminal and the second load terminal such that the linear amplifier output terminal and the first load terminal are coupled via the third switch and the linear amplifier output terminal and the second load terminal are coupled via the fourth switch; and
   a controller configured to control the first plurality of switches, the second plurality of switches, the third plurality of switches, and the linear amplifier in order to generate the load voltage as a function of an input signal to the controller such that energy delivered to the load output is supplied predominantly by the power converter, and such that one of the first switch and the second switch operates in a linear region of operation and one of the third switch and the fourth switch operates in a saturated region of operation for a predominance of a dynamic range of the load voltage.

2. The switching power stage of claim 1, further comprising a capacitor coupled between the first load terminal and the second load terminal.

3. The switching power stage of claim 1, further comprising a capacitor coupled between the first load terminal and one of a first supply terminal having a first voltage and a second supply terminal having a second voltage.

4. The switching power stage of claim 3, wherein a second terminal of the power inductor is coupled to the power converter output terminal.

5. The switching power stage of claim 3, wherein the first plurality of switches comprises:
   a first switch coupled between a second terminal of the power inductor and the power converter output terminal; and
   a second switch coupled between the second terminal of the power inductor and the second supply terminal.

6. The switching power stage of claim 1, further comprising:
   a first capacitor coupled between the power converter output terminal and one of a first supply terminal having a first voltage and a second supply terminal having a second voltage; and
   a second capacitor coupled between the second load terminal and one of the first supply terminal and the second supply terminal.

7. The switching power stage of claim 1, wherein the first plurality of switches comprises:
   a fifth switch coupled between a first terminal of the power inductor and a first supply terminal having a first voltage; and
   a sixth switch coupled between the first terminal of the power inductor and a second supply terminal having a second voltage.

8. The switching power stage of claim 7, wherein the first plurality of switches further comprises:
   a seventh switch coupled between a second terminal of the power inductor and the power converter output terminal; and
   an eighth switch coupled between the second terminal of the power inductor and the second supply terminal.

9. The switching power stage of claim 1, wherein the controller further controls the first plurality of switches to drive the first load voltage as a function of a target output voltage which is a function of the input signal.

10. The switching power stage of claim 9, wherein the function of the target output voltage includes a magnitude of the target output voltage.

11. The switching power stage of claim 9, wherein the function of the target output voltage includes a lower saturation limit of the power converter output terminal.

12. The switching power stage of claim 11, wherein the controller further controls the linear amplifier to drive a non-zero voltage as the second load voltage in order to increase a common mode voltage of the first load terminal and the second load terminal when the power converter output terminal is driven to the lower saturation limit in order to produce the output voltage as a function of an input signal to the controller while minimizing non-linearities of the output voltage as a function of the input signal.

13. The switching power stage of claim 1, wherein the controller further controls the linear amplifier to drive the second load voltage as a function of a target output voltage which is a function of the input signal.

14. A method for producing a load voltage at a load output of the switching power stage, the load output comprising a first load terminal having a first load voltage and a second load terminal having a second load voltage such that the load voltage comprises a difference between the first load voltage and the second load voltage, wherein the switching power stage comprises:
a power converter comprising a power inductor and a first plurality of switches, wherein the power converter is configured to drive a power converter output terminal coupled to the first load terminal in order to drive the first load terminal;
a linear amplifier configured to drive a linear amplifier output terminal coupled to the second load terminal in order to drive the second load terminal;
a second plurality of switches, comprising at least a first switch coupled between the power converter output terminal and the first load terminal and a second switch coupled between the power converter output terminal and the second load terminal such that the power converter output terminal and the first load terminal are coupled via the first switch and the power converter output terminal and the second load terminal are coupled via the second switch; and
a third plurality of switches, comprising at least a third switch coupled between the linear amplifier output terminal and the first load terminal and a fourth switch coupled between the linear amplifier output terminal and the second load terminal such that the linear amplifier output terminal and the first load terminal are coupled via the third switch and the linear amplifier output terminal and the second load terminal are coupled via the fourth switch;
wherein the method comprises controlling the first plurality of switches, the second plurality of switches, the third plurality of switches, and the linear amplifier in order to generate the load voltage as a function of an input signal to the controller such that energy delivered to the load output is supplied predominantly by the power converter, and such that one of the first switch and the second switch operates in a linear region of operation and one of the third switch and the fourth switch operates in a saturated region of operation for a predominance of a dynamic range of the load voltage.

15. The method of claim 14, further comprising a capacitor coupled between the first load terminal and the second load terminal.

16. The method of claim 14, further comprising a capacitor coupled between the first load terminal and one of a first supply terminal having a first voltage and a second supply terminal having a second voltage.

17. The method of claim 16, wherein a second terminal of the power inductor is coupled to the power converter output terminal.

18. The method of claim 16, wherein the first plurality of switches comprises:
a first switch coupled between a second terminal of the power inductor and the power converter output terminal; and
a second switch coupled between the second terminal of the power inductor and the second supply terminal.

19. The method of claim 14, further comprising:
a first capacitor coupled between the power converter output terminal and one of a first supply terminal having a first voltage and a second supply terminal having a second voltage; and
a second capacitor coupled between the second load terminal and one of the first supply terminal and the second supply terminal.

20. The method of claim 14, wherein the first plurality of switches comprises:
a fifth switch coupled between a first terminal of the power inductor and a first supply terminal having a first voltage; and
a sixth switch coupled between the first terminal of the power inductor and a second supply terminal having a second voltage.

21. The method of claim 20, wherein the first plurality of switches further comprises:
a seventh switch coupled between a second terminal of the power inductor and the power converter output terminal; and
an eighth switch coupled between the second terminal of the power inductor and the second supply terminal.

22. The method of claim 14, wherein the controller further controls the first plurality of switches to drive the first load voltage as a function of a target output voltage which is a function of the input signal.

23. The method of claim 22, wherein the function of the target output voltage includes a magnitude of the target output voltage.

24. The method of claim 23, wherein the function of the target output voltage includes a lower saturation limit of the power converter output terminal.

25. The method of claim 24, wherein the controller further controls the linear amplifier to drive a non-zero voltage as the second load voltage in order to increase a common mode voltage of the first load terminal and the second load terminal when the power converter output terminal is driven to the lower saturation limit in order to produce the output voltage as a function of an input signal to the controller while minimizing non-linearities of the output voltage as a function of the input signal.

26. The method of claim 14, wherein the controller further controls the linear amplifier to drive the second load voltage as a function of a target output voltage which is a function of the input signal.

27. A switching power stage for producing a load voltage at a load output of the switching power stage, the load output comprising a first load terminal having a first load voltage and a second load terminal having a second load voltage such that the load voltage comprises a difference between the first load voltage and the second load voltage, the switching power stage comprising:
a first processing path configured to process a first signal derived from an input signal to generate a first path voltage at a first processing path output;

a second processing path configured to process a second signal derived from the input signal to generate a second path voltage at a second processing path output;

a first plurality of switches, comprising at least a first switch coupled between the first processing path output and the first load terminal and a second switch coupled between the first processing path output and the second load terminal;

a second plurality of switches, comprising at least a third switch coupled between the second processing path output and the first load terminal and a fourth switch coupled between the second processing path output and the second load terminal; and a controller configured to control the first plurality of switches and the second plurality of switches in order to generate the load voltage as a function of the input signal such that one of the first switch and the second switch operates in a linear region of operation and one of the third switch and the fourth switch operates in a saturated region of operation for a predominance of a dynamic range of the load voltage.

28. A method for producing a load voltage at a load output of a switching power stage, the load output comprising a first load terminal having a first load voltage and a second load terminal having a second load voltage such that the load voltage comprises a difference between the first load voltage and the second load voltage, wherein the switching power stage comprises a first processing path configured to process a first signal derived from an input signal to generate a first path voltage at a first processing path output, a second processing path configured to process a second signal derived from the input signal to generate a second path voltage at a second processing path output, a first plurality of switches, comprising at least a first switch coupled between the first processing path output and the first load terminal and a second switch coupled between the first processing path output and the second load terminal, and a second plurality of switches, comprising at least a third switch coupled between the second processing path output and the first load terminal and a fourth switch coupled between the second processing path output and the second load terminal, the method comprising:

controlling the first plurality of switches and the second plurality of switches in order to generate the load voltage as a function of the input signal such that one of the first switch and the second switch operates in a linear region of operation and one of the third switch and the fourth switch operates in a saturated region of operation for a predominance of a dynamic range of the load voltage.

* * * * *